United States Patent [19]

Harvey et al.

[11] Patent Number: 5,350,931
[45] Date of Patent: Sep. 27, 1994

[54] DOUBLE BARRIER RESONANT PROPAGATION FILTER

[75] Inventors: James F. Harvey, Tinton Falls; Robert A. Lux, Toms River, both of N.J.

[73] Assignee: The United States of America as represented by the Secretary of the Army, Washington, D.C.

[21] Appl. No.: 64,774

[22] Filed: May 19, 1993

Related U.S. Application Data

[63] Continuation-in-part of Ser. No. 736,886, Jul. 29, 1991, abandoned.

[51] Int. Cl.⁵ .................. H01L 29/161; H01L 27/12; H01L 29/68
[52] U.S. Cl. .......................... 257/14; 257/12; 257/15; 257/25; 257/26; 257/29; 257/198
[58] Field of Search .............. 257/12, 14, 15, 25, 257/26, 29, 198

[56] References Cited

U.S. PATENT DOCUMENTS

| | | | |
|---|---|---|---|
| 4,866,488 | 9/1989 | Frensley | 257/20 |
| 4,987,458 | 1/1991 | Gaylord et al. | 257/22 |
| 5,027,179 | 6/1991 | Yokoyama et al. | 257/198 |
| 5,121,181 | 6/1992 | Smith, III et al. | 257/21 |
| 5,130,766 | 7/1992 | Arimoto et al. | 257/20 |
| 5,233,205 | 8/1993 | Usagawa et al. | 257/25 |

OTHER PUBLICATIONS

Choi et al, "Self-Consistent Resonant States and Phase Coherence in a Wide Double-Barrier Structure," Appl. Phys. Lett., vol. 54, No. 4 Jan. 23, 1989, pp. 359–361.
GaAs and Related Compounds–1988, Inst. of Physics, Philadelphia, 1989 by Sakaki.
*Nanostructure Physics and Fabrication,* Academic Press, San Diego 1989 articles by F. Sols et al, entitled "Criteria For Transistor Action Based on Quantum Interference Phenomena" by D. C. Miller et al, entitled, Modulation of the Conductance of T-Shaped Electron Waveguide Structures with a Remote Gate, by S. Bandyopadhyay et al, entitled, Quantum Devices Based on Phase Coherent Lateral Quantum Transport.

*Primary Examiner*—Rolf Hille
*Assistant Examiner*—Mahshid Saadat
*Attorney, Agent, or Firm*—Michael Zelenka; William H. Anderson

[57] ABSTRACT

One or more double barrier resonant tunneling filters are provided for electron propagation mode control in nanostructure quantum wire electron waveguides and in quantum interference devices in the waveguide.

6 Claims, 1 Drawing Sheet

DOUBLE BARRIER RESONANT PROPAGATION FILTER

GOVERNMENT INTEREST

The invention described herein may be manufactured, used, and licensed by or for the Government of the United States of America without the payment to us of any royalty thereon.

CONTINUATION IN PART

The present application is a continuation in part of U.S. Patent and Trademark Office Ser. No. 07/736,886, filed by Harvey et al on Jul. 29, 1991 and entitled, "Double Barrier Resonant Propagation Filter," now abandoned.

FIELD OF THE INVENTION

This invention relates to a quantum interference device for electron waveguide structures, and more specifically relates to a double barrier resonant tunneling filter for electron propagation mode control in nanostructure quantum wire (electron waveguide) structures and quantum interference devices fabricated in the waveguide structures.

BACKGROUND OF THE INVENTION

Electron waveguide devices are well known and are based on the propagation of the electron as described by its wave character and governed by the Schroedinger Equation. (For purposes of this description, the term, "electron waveguide," shall refer to mesoscopic semiconductor quantum structures the width of which being comparable to the electron wavelength.) They are similar in concept to microwave waveguides, but significantly different in application and detailed operation because standard classical transport theory, where self-averaging over many microscopic configurations is assumed, simply cannot describe these mesoscopic systems. One such difference is that undesirable electron waveguide modes can propagate through integrated circuits built with such electron waveguide elements. This leads to degradation in the operation of quantum interference devices used in such mesoscopic circuits as well as degradation in the propagation of the electron waves in interconnecting waveguide structures both of which are caused by the superposition of different longitudinal and lateral propagation modes.

The advantages of single mode propagation in electron waveguides (quantum wires) are discussed in *GaAs and Related Compounds—1988, Inst. of Physics*, Philadelphia, 1989 in an article by Sakaki.

The operation of many mesoscopic devices, for example, the quantum modulated transistor (QMT or the T-shaped electron waveguide transistor), the quantum wire transistor, and the Aharonhov-Bohm interferometer are all controlled by interference of the electron wave functions. The principles of T-shaped electron waveguide transistors and the Aharonhov-Bohm interferometers are described in the publication *Nanostructure Physics and Fabrication, Academic Press*, San Diego 1989 in articles by F. Sols et al, entitled, "Criteria For Transistor Action Based on Quantum Interference Phenomena," by D. C. Miller et al, entitled, "Modulation of the Conductance of T-Shaped Electron Waveguide Structures with a Remote Gate," and by S. Bandyopadhyay et al, entitled, "Quantum Devices Based on Phase Coherent Lateral Quantum Transport," respectively, all of which are incorporated herein by reference.

Optimum operation of these quantum interference devices requires a sharp interference pattern and requires that only one lateral waveguide mode be present (preferably the fundamental mode) and that the momentum $k_x$ in the direction of propagation be restricted to a narrow range of values. Therefore, propagation through an electron waveguide is most efficient at electron energies below the minimum required for scattering into higher lateral modes by elastic or phonon processes and below the minimum energy for significant inelastic scattering.

BRIEF DESCRIPTION OF THE INVENTION

In accordance with the invention, a resonant tunneling structure is employed as a filter by using the band edge displacements of dissimilar semiconductors or by using electrostatic fields under a conductive gate structure to produce the potential energy profiles of a quantum well confined by two barriers. The use of such a resonant tunneling structure improves the performance of quantum interference devices and the integrated circuits composed of them.

Such resonant tunneling structures may be embedded in the electron waveguide structures inherent in individual quantum interference devices and connecting these devices. The advantages of such a composite device is that undesirable electron propagation modes will be suppressed in quantum interference devices and integrated circuits which are built with these filters in the waveguide elements.

Therefore in accordance with the invention, the resonant tunneling structure comprises a quantum well sandwiched by two quantum barriers. The resonant tunneling structure is fabricated to have a potential distribution such that the energy level of a resonance in the quantum well between the barriers permits maximum transmission for electron wave functions with a very narrow range of values of momentum in the propagation direction. This range of high transmission is sharply peaked around a momentum value $k_x$, corresponding to the resonance condition in the quantum well. This maximum value of $k_x$ can be calculated from Schroedinger's equation as described by M. O. Vassel et al., Appl. Phys., 54, 5206 (1983). Briefly though, the profile of $k_x$ transmitted by the filter is determined primarily by the width and height of the barriers.

Further in accordance with the invention, the resonant tunneling structure filter is fabricated within a quantum wire (or "electronic waveguide") such that the lateral dimensions of the resonant tunneling structure are constrained thereby only allowing propagation of a narrow range of momenta in the direction of propagation and only allowing discrete values of momentum in the lateral directions. (For purposes of the remainder of this Description, the term, "laterally constrained" and "laterally confined," or terms to that effect shall refer to the fabrication of mesoscopic devices such that any propagating carriers within the devices cannot propagate in the lateral (y and z) directions. The discrete values of the lateral momentum results in allowed energy subbands separated by energy differences which are determined by the dimensions of lateral constraint. Therefore, the resonant tunneling structure filters out electron wave functions with values $k_x$ outside the desirable range for an optimum interference pattern in the subsequent interference devices. During propagation in a waveguide, the electrons suffer collisions and phonon interactions which broaden the spread of $k_x$ values in their wave functions. This spread of $k_x$ values can be reduced to the optimum range by the resonant tunneling structure positioned immediately prior to an interference device. In addition to limiting $k_x$ to values for optimum device performance, the filtering of the higher values of $k_x$ (and hence higher energies) improves the propagation characteristics by reducing scattering in the waveguide.

The propagation of electron waves in a waveguide past an abrupt waveguide element such as a sharp corner or T-junction converts some of the fundamental lateral mode waves into higher order lateral modes, where energetically allowed. These abrupt waveguide elements occur throughout a waveguide system used to interconnect an integrated circuit based on quantum interference devices. Furthermore, the T junction is an inherent functional part of a QMT, a T shaped electron waveguide transistor, or a quantum wire transistor. The value of $k_x$ for the second lateral waveguide mode generated in these abrupt waveguide configurations, $k_x^s$, is substantially different from $k_x$ for the fundamental lateral mode, $k_x^f$, and may be expressed as:

$$k_x^s = \left[ \frac{(k_x^f)^2}{2m} - \Delta\Sigma \right]^{\frac{1}{2}} (2m)^{\frac{1}{2}}$$

where $\Delta\Sigma$ is the energy difference between the subband edges of the two modes and m is the effective mass. The resonant tunneling structures of the invention can be introduced into the waveguides to selectively block or pass either of the two modes by discriminating between $k_x^s$ and $k_x^f$.

The invention can be used in a number of ways. For example, a resonant tunneling structure can be inserted into an elongated electron waveguide system after a long propagation region. In another embodiment, a second resonant tunneling can be connected to the first waveguide and pass only a second lateral mode into a second waveguide section terminated by an absorber. In a still further embodiment, four resonant tunneling devices can be disposed in a quantum interference device such that one passes only the fundamental lateral mode into the interference region, a second passes only the fundamental mode to a gate region, a third passes the fundamental mode to the drain or to subsequent quantum interference transistors, and the fourth passes an unwanted second order lateral mode, generated in a T section, to a further waveguide segment terminated by an absorber.

Thus, in accordance with the invention, resonant tunneling structures are incorporated into waveguide segments and into quantum interference devices themselves in order to control the $k_x$ propagation mode, and thereby the lateral modes, for optimum performance of the interference devices and for optimum propagation characteristics in the waveguide segments.

BRIEF DESCRIPTION OF THE DRAWINGS

These and other objects, features, and details of the invention will become apparent in light of the ensuing detailed disclosure, and particularly in light of the drawings wherein.

DETAILED DESCRIPTION OF THE DRAWINGS

Figure 1:
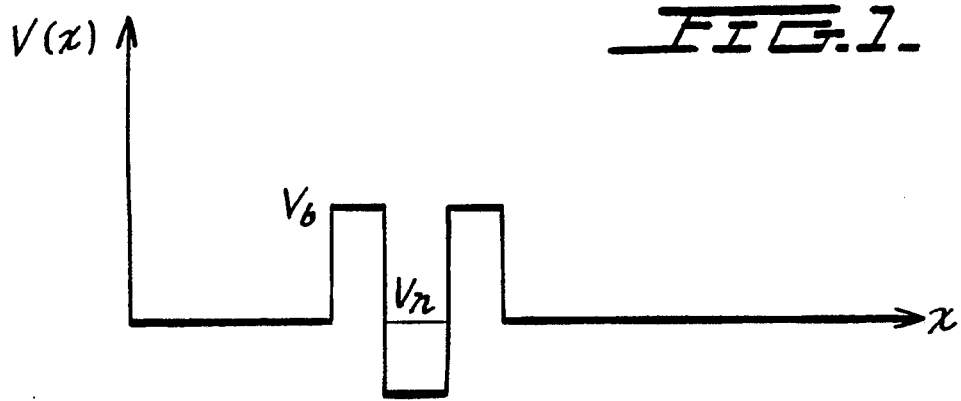
FIG. 1 shows the potential energy $V_x$ on the vertical scale and the distance x along a waveguide, illustrating a quantum well confined between two barriers within a waveguide.

Referring first to FIG. 1, V is the potential energy of the resonant tunneling structure and/or the electron waveguide according to the present invention and x is the direction of the propagation along the electron waveguide and perpendicular to the planes of discontinuity in the potential. $V_n$ is the energy level of the resonance in the quantum well and $V_b$ is the height of the confining potential barriers. As shown, the potential energy of the quantum well necessarily must be lower than that of the confining potential barriers, but may be the same as the electron waveguide. The energy level $V_n$ is determined primarily by the thickness of the quantum well. Those skilled in the art will be readily able to form such a resonant tunneling structure from any number of semiconductor materials and engineering their dimensions according to the current description.

Figure 2:
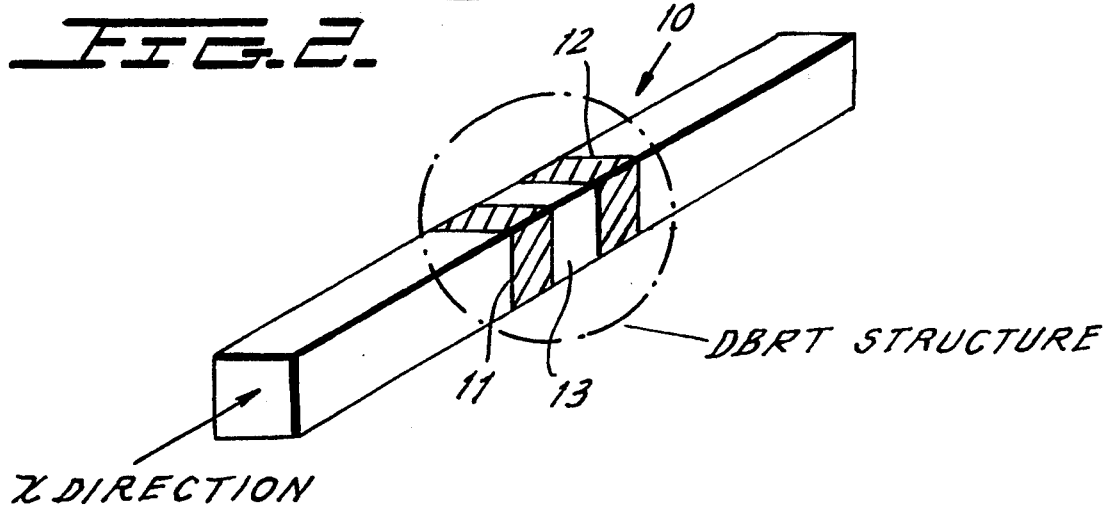
FIG. 2 is a perspective view of a gallium arsenide waveguide which contains a resonant tunneling structure based on dissimilar semiconductors in accordance with the invention.

Referring now to FIG. 2, there is shown a perspective view of a gallium arsenide (GaAs) electron waveguide which contains a resonant tunneling structure based on dissimilar bandgaps of semiconductors in accordance with the invention. The resonant tunneling structure is fabricated to have a potential distribution such that the energy level of the resonance in the quantum well between the barriers permits maximum transmission for electron wave functions with a very narrow range of values of momentum in the propagation direction.

The resonant tunneling structure is disposed within the electron waveguide such that the lateral dimensions of the resonant tunneling structure are constrained thereby only allowing propagation of this narrow range of momenta in the direction of propagation and only allowing discrete values of momentum in the lateral directions. Moreover, the composition and dimensions of the GaAs electron waveguide are selected such that the electron waveguide has a thermal population of electrical carriers in the lowest energy subband. By only permitting discrete values of the lateral momentum through the resonant tunneling structure, only predetermined energy subbands are formed which are separated by energy differences that are determined by the dimensions of lateral constraint. Therefore, by combining such a quantum wire (or "electronic waveguide") with a resonant tunneling structure, the carriers with values $k_x$ outside the desirable range for an optimum interference pattern for subsequent interference devices are filtered out. In addition to limiting $k_x$ to values for optimum device performance, the filtering of the higher values of $k_x$ (and hence higher energies) improves the propagation characteristics by reducing scattering in the waveguide.

The propagation of electron waves in a waveguide past an abrupt waveguide element such as a sharp corner or T-junction (FIGS. 4–5) converts some of the fundamental lateral mode waves into higher order lateral modes, where energetically allowed. These abrupt waveguide elements occur throughout a waveguide system used to interconnect an integrated circuit based on quantum interference devices. Therefore, resonant tunneling structures of the invention can be introduced into the waveguides which selectively block or pass either of the two modes by discriminating between $k_x^s$ and $k_x^f$.

Specifically, FIG. 2 shows, one possible device arrangement for the resonant tunneling structure in a gallium arsenide electron waveguide 10. Waveguide 10 may lie on a layer of dissimilar semiconductor composition or it may be embedded within a dissimilar semiconductor layer. A resonant tunneling structure is formed in the gallium arsenide waveguide 10 and preferably consists of first and second layers of undoped aluminum gallium arsenide 11 and 12, respectively, spaced by an undoped indium gallium arsenide quantum well 13. The conduction band edge energy of the waveguide material 10 may be the same as that of the quantum well material 13. The resonant energy level $V_n$ (FIG. 1) can then be adjusted in part by the thickness of the quantum well, and, if desired, by a bias voltage across the resonant tunneling structure which will lower $V_n$ to pass electrons of relatively low energy. A metal gate may also be formed on the top of the waveguide to raise the conduction band edge potential energy.

The following typical dimensions can be used:
height and width of the electron waveguide: 10 nanometers
thickness of the AlGaAs barriers: 5 nanometers
thickness of the InGaAs quantum well: 5 nanometers
composition of the $Al_xGa_{1-x}As$: x—0.25
composition of the $In_xGa_{1-x}As$: x—0.53

This structure is supported by a semiconductor substrate and semiconductor epilayer forming a potential barrier in the conduction band for the waveguide and quantum well sections. For example, a semi-insulating GaAs substrate with a layer of $Al_xGa_{1-x}As$ (x=0.25) barrier material can be used. The only limitation being that the dimensions of the resonant tunneling structure and electron waveguide must be such that lateral dimensions of the resonant tunneling structure and electron waveguide are constrained. Several methods of fabricating the elements described herein are disclosed by James Harbison in an article entitled, "The Epitaxy of Novel Quantum Well Materials and Microstructures," *Institute of Physics Conferences*, Ser. No. 96, Chapter 1, 1989, which is incorporated herein by reference. As those skilled in the art will recognize, most any of the growth and etching procedures described in this article will be suitable to fabricate the present invention.

While any desired materials can be used, typical examples of materials which can be used are a GaAs waveguide, $Al_xGa_{1-x}As$ barriers, and GaAs or $In_xGa_{1-x}As$ quantum wells.

Figure 3:
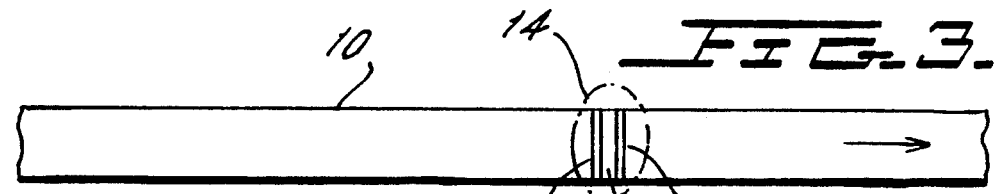
FIG. 3 shows, in schematic form, a resonant tunneling structure in a single waveguide length.
Figure 4:
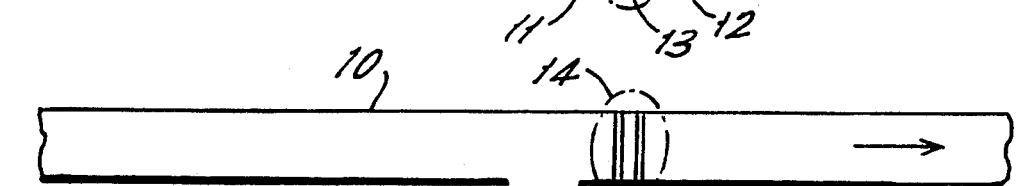
FIG. 4 shows a further embodiment of the invention which employs a second resonant tunneling structure for passing a second lateral mode into another waveguide section which is terminated by an absorber.

FIGS. 3 and 4 show possible configurations for the introduction of resonant tunneling structures into the electron waveguide system after a long propagation region. Referring first to FIG. 3, the resonant tunneling structure 14 in waveguide 10 only passes a narrow range of values of $k_x$ for optimum interference patterns in subsequent devices and blocks other values of $k_x$ in the fundamental lateral mode, as well as the most probable propagating modes with higher order lateral modes.

The resonant tunneling structure 14 in the waveguide of FIG. 4 serves the same function as in FIG. 3. However, in FIG. 4, an additional resonant tunneling structure 15 is provided in waveguide section 16 and 20 passes only the second lateral mode. The additional waveguide section 16 is terminated by an absorber, not shown. This second resonant tunneling structure 15 thus provides an alternate path for electrons with undesirable modes, reducing the amount of reflection back into waveguide element 10.

Figure 5:
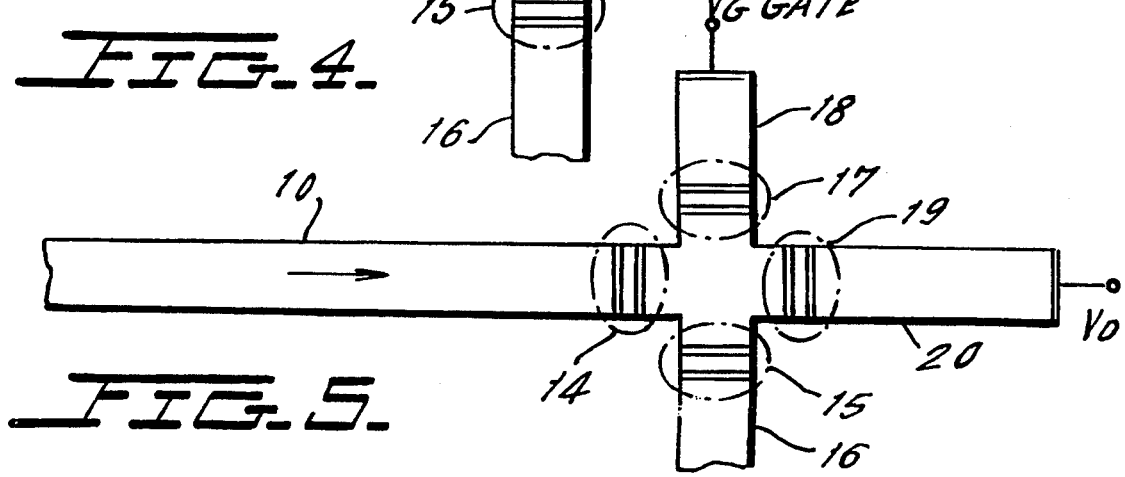
FIG. 5 shows still another embodiment of the invention, employing four resonant tunneling structures in a quantum interference transistor.

A configuration for the introduction of resonant tunneling structures in quantum interference transistors themselves is described in FIG. 5. In FIG. 5, resonant tunneling structure 14 passes only the optimum narrow range of $k_x$ in the fundamental lateral mode and blocks most of the electrons in higher order lateral modes. Resonant tunneling structure 17 passes only the optimum range of k in the fundamental mode into the waveguide section 18, labelled "gate" in FIG. 5. Resonant tunneling structure 19 in section 20 passes only the optimum range of $k_x$ in the fundamental mode to the drain or to subsequent quantum interference transistors. Resonant tunneling structure 15, as in FIG. 4, allows the undesirable modes, necessarily generated in the T-section, to pass into waveguide segment 16 terminated by an absorber. For any given composite device not all the resonant tunneling structures 14, 15, 17 and 19 will necessarily be used. Any one or combination of them would improve the performance of the basic quantum interference transistor.

Although the present invention has been described in relation to a particular embodiment thereof, many other variations and modifications and other uses will become apparent to those skilled in the art. It is preferred, therefore, that the present invention be limited not by the specific disclosure herein, but only by the appended claims.

What is claimed is:

1. A resonant propagation filter for applications in quantum wire waveguide comprising:
    first and second regions of a first semiconductor material having a first conduction band edge energy; and
    a third region of a second semiconductor material with a second conduction band edge energy which is lower than that of said first and second regions, the third region being disposed between said first and second regions;
    a first quantum wire waveguide having a conduction band edge energy similar to the third region;
    wherein the first, second and third regions form a resonant tunneling structure and wherein said resonant tunneling structure is disposed within said electron waveguide such that the lateral dimensions of the resonant tunneling structure are constrained thereby permitting only a predetermined range of electron momenta in a direction of electron propagation and only discrete values of momentum in the lateral directions;
    said filter permitting predetermined propagating modes to pass through said waveguide.

2. The filter of claim 1 wherein said first and second regions define first and second barrier regions of a quantum well due to the difference in the conduction band edge energies of said regions to the conduction band edge energies of the third region.

3. The filter of claim 1 wherein a resonant energy level, $V_n$, of said filter is adjusted by adjusting the thickness of said third region.

4. The filter of claim 1 wherein said waveguide is GaAs, said first and second regions are $Al_xGa_{1-x}As$ and said third region is selected from the group consisting of GaAs or InGaAs.

5. The filter of claim 1 which further includes at least a second quantum wire waveguide which intersects and couples to an intermediate portion of said first quantum wire; and at least a second barrier resonant tunneling filter disposed in series within the length of said second waveguide and having a structure similar to that of the first-mentioned filter.

6. The filter of claim 4 which further includes a second quantum wire waveguide which intersects and couples to an intermediate portion of said first quantum wire; and a second barrier resonant tunneling filter disposed in series within the length of said second waveguide and having a structure similar to that of the first-mentioned filter.

* * * * *